(12) United States Patent
Yu et al.

(10) Patent No.: US 8,666,339 B2
(45) Date of Patent: Mar. 4, 2014

(54) RADIO FREQUENCY POWER AMPLIFIER WITH LOW DYNAMIC ERROR VECTOR MAGNITUDE

(75) Inventors: Haoyang Yu, Nashua, NH (US); Stephen J. Nash, Cumberland, RI (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 13/434,734

(22) Filed: Mar. 29, 2012

(65) Prior Publication Data

US 2013/0260704 A1  Oct. 3, 2013

(51) Int. Cl.
*H04B 1/04* (2006.01)

(52) U.S. Cl.
USPC ..................................... 455/127.1; 330/296

(58) Field of Classification Search
USPC .............. 455/91, 103, 104, 108, 115.1, 126, 455/127.1, 127.2, 127.3, 127.4; 330/295, 330/296
See application file for complete search history.

(56) References Cited

U.S. PATENT DOCUMENTS

| | | | |
|---|---|---|---|
| 6,356,745 B1* | 3/2002 | Lee et al. | 455/127.2 |
| 7,383,027 B2* | 6/2008 | Matsuura et al. | 455/127.1 |
| 2006/0264186 A1* | 11/2006 | Akizuki et al. | 455/108 |

\* cited by examiner

*Primary Examiner* — Thanh Le
(74) *Attorney, Agent, or Firm* — Schwabe, Williamson & Wyatt, P.C.

(57) ABSTRACT

Embodiments provide a multi-stage radio frequency (RF) power amplifier (PA) having a low dynamic error vector magnitude (EVM). A first stage of the RF PA may include a first active device configured to receive an enable signal and to turn on in response to the enable signal, thereby activating the first stage. The RF PA may further include a second active device coupled in series with the first active device and configured to receive a main supply voltage. The second active device may provide a first supply voltage across the first active device that is less than and independent of the main supply voltage. One of the first active device or the second active device may be configured to receive an RF input signal and to pass an amplified RF output signal to a second stage of the RF PA circuit.

19 Claims, 3 Drawing Sheets

US 8,666,339 B2

RADIO FREQUENCY POWER AMPLIFIER WITH LOW DYNAMIC ERROR VECTOR MAGNITUDE

FIELD

Embodiments of the present disclosure relate generally to the field of circuits, and more particularly to radio frequency power amplifiers with low dynamic error vector magnitudes.

BACKGROUND

Many wireless communication systems, such as wireless local area networks (WLANs) and wireless metropolitan area networks (WMANs), use orthogonal frequency division multiplexing (OFDM) modulation to achieve high data rates. Error vector magnitude (EVM) is an important parameter to measure signal linearity of the OFDM signal, especially for higher data rates. Many OFDM systems use Time Division Duplexing (TDD). Accordingly, a radio frequency power amplifier in the transmit chain needs to be pulsed on and off during operation. The EVM measured under these conditions is referred to as dynamic EVM. Ideally, dynamic EVM would be the same as static EVM. However, transient effects typically cause dynamic EVM to be higher than static EVM.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Figure 1:
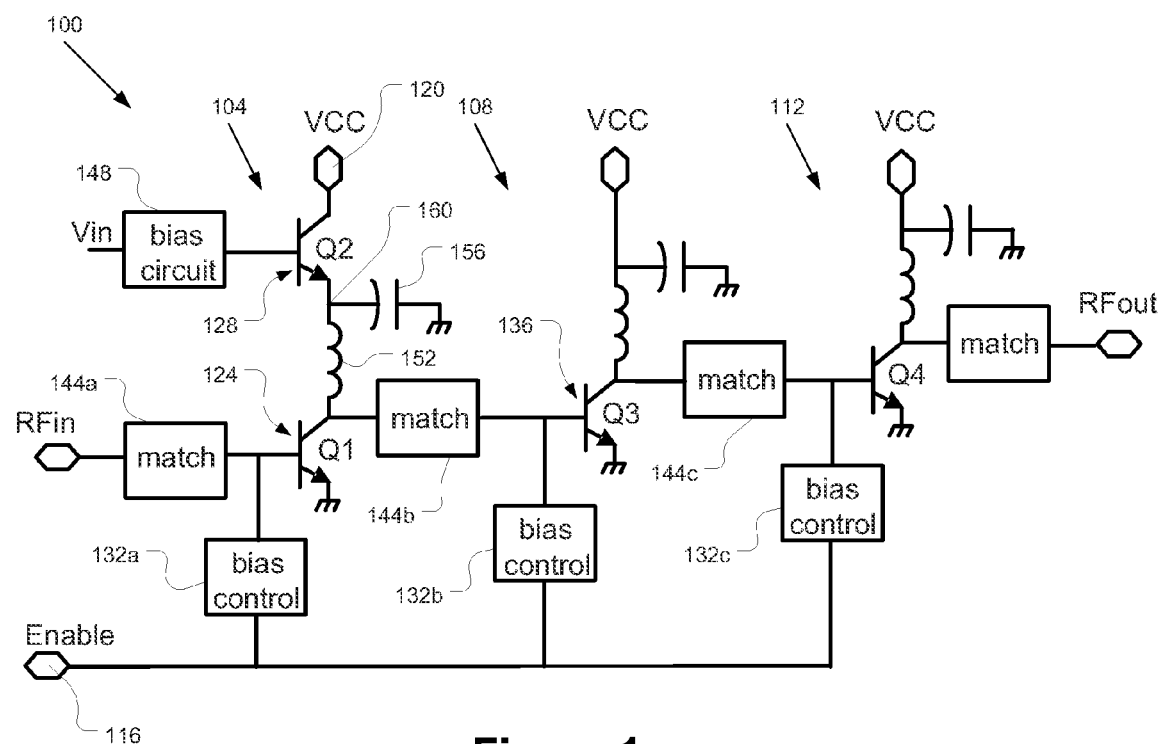
FIG. 1 illustrates a circuit diagram of a radio frequency power amplifier in accordance with various embodiments.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Various embodiments may provide a radio frequency (RF) power amplifier (PA) circuit including an enable terminal configured to receive an enable signal and a main supply terminal configured to receive a main supply voltage. The RF PA circuit may further include a plurality of amplifier stages including a first stage. The first stage may include a first active device configured to receive the enable signal and to turn on in response to the enable signal, thereby activating the first stage. The RF PA circuit may further include a second active device coupled in series with the first active device and configured to receive the main supply voltage. The second active device may provide a first supply voltage across the first active device that is less than the main supply voltage. A bypass capacitor may be coupled with a node between the first active device and the second active device to divert RF signals at the node. One of the first active device or the second active device may be configured to receive an RF input signal and to pass an amplified RF output signal to a second stage of the RF PA circuit. In various embodiments, the first active device and/or second active device may include one or more transistors, such as bipolar junction (e.g., heterojunction bipolar) transistors and/or field effect transistors.

FIG. 1 illustrates an RF PA circuit 100 in accordance with various embodiments. The RF PA 100 may receive an RF input signal RFin and produce an amplified RF output signal RFout. The RF PA 100 may be used, for example, to amplify RFin for transmission over a wireless communications network. In various embodiments, the RF PA 100 may include a plurality of amplifier stages, such as a first stage 104, a second stage 108, and a third stage 112. Other embodiments of the RF PA 100 may include a greater or lesser number of stages than are shown in FIG. 1. The RF PA 100 may further include an enable terminal 116 and a main supply terminal 120. The main supply terminal 120 may receive a main supply voltage VCC. The enable terminal 116 may receive an enable signal to turn the RF PA 100 on and/or off.

The first stage 104 may include a first active device 124 (e.g., transistor Q1) and a second active device 128 (e.g., transistor Q2). Although the first active device 124 and second active device 128 are shown to include one transistor, in other embodiments the first active device 124 and/or second active device 128 may include a plurality of transistors. Additionally, although Q1 and Q2 are shown to be heterojunction bipolar transistors (HBTs), in other embodiments Q1 and/or Q2 may be any suitable type of transistor, such as another type of bipolar junction transistor and/or a field-effect transistor.

The base terminal of Q1 may be coupled with the enable terminal 116 through a bias control module 132a. The bias control module 132a may pass the enable signal to Q1 and bias Q1 in active mode. In some embodiments, the bias control module 132a may include a current mirror.

In various embodiments, the enable signal may be a direct current (DC) signal. Transistor Q1 may be turned on if the enable signal has a first logic state (e.g., a logic 1) and may be off if the enable signal has a second logic state (e.g., a logic 0). If Q1 is on, Q1 may amplify RFin and pass the amplified signal to the second stage 108. The second stage 108 may include a third active device 136 (e.g., transistor Q3) that amplifies the RF output signal of Q1 and passes it to the third stage 112. The third stage 112 may include a fourth active device 140 (e.g., transistor Q4) that amplifies the RF output signal of Q3 to produce the RFout signal of the RF PA 100. Matching circuits 144a-d may present matched impedances at the input and output of each stage (e.g., to maximize power transfer and/or minimize signal reflections). Transistors Q3 and Q4 may be biased (e.g., in active mode) by bias control modules 132b and 132c, respectively.

In some embodiments, such as in a communications system that uses time division duplexing (TDD), the RF PA 100 may be pulsed on and off during operation. In these embodiments, the enable signal may resemble a square wave to turn the RF PA 100 on and off repeatedly. The RF PA 100 may be pulsed on and off at a high frequency (e.g., with communications systems employing orthogonal frequency division multiplexing (OFDM)).

In various embodiments, a first supply voltage across Q1 (e.g., the voltage drop from the collector node to the emitter node of Q1) may be less than a second supply voltage across Q3 and/or a third supply voltage across Q4. For example, the second supply voltage and/or third supply voltage may be equal to the main supply voltage, and the first supply voltage may be less than the main supply voltage. In various embodiments, the first supply voltage may be independent from the main supply voltage (e.g., the value of the first supply voltage may not depend on the value of the main supply voltage).

In various embodiments, the first supply voltage may be isolated from VCC by Q2. Transistor Q2 may be coupled in series with Q1 and may be coupled with the main supply terminal 120 to receive the main supply voltage (e.g., at the collector node of Q2). Accordingly, Q2 may provide an active load between the main supply terminal 120 and Q1 so that the first supply voltage is less than and independent from the main supply voltage. A bias circuit 148 may be coupled to the base of Q2 to bias Q2 (e.g., in active mode). The bias circuit 148 may receive an input voltage Vin. The input voltage may be regulated, and may not vary with VCC. The input voltage may be provided by a switchable regulated voltage supply. For example, the bias circuit 148 may be coupled with the enable terminal 116 to receive the regulated enable signal as input voltage. In these embodiments, Q2 may turn on if the enable signal turns on the RF PA 100. In other embodiments, the bias circuit 148 may be coupled with another voltage source, such as the main supply terminal 120.

A choking inductor 152 may be coupled between Q1 and Q2 to prevent RF signals from passing to Q2. Additionally, a bypass capacitor 156 may be coupled to a node 160 between Q1 and Q2 to divert RF signals at the node, thereby isolating Q2 from the RF path. Since Q2 may not be in the RF path of the RF PA 100, the matching circuits 144a and 144b may not need to be changed if Q2 is placed in RF PA 100 (e.g., the matching circuits 144a and 144b may be the same as for a design of RF PA 100 that does not include Q2).

In some embodiments, the main supply voltage may be about 3 Volts (V) to about 5V. As stated above, the first supply voltage across Q1 may be dependent on the input voltage received by the bias circuit 148. The regulated input voltage to the bias circuit 148 may stay within a relatively narrow range, such as a range of about 0.1V. In some embodiments, the first supply voltage may be about 0.2V to about 2V.

A lower supply voltage may improve a transient response of Q1, providing a fast transient response when Q1 is turned on and/or off. Accordingly, the gain provided by Q1 may also exhibit a fast transient response, thereby causing the first stage 104 of the RF PA 100 to have a low dynamic error vector magnitude (EVM). Additionally, Q2 may act as a current source to Q1. The lower voltage and fast current transient response of Q2 may enable Q1 to exhibit a fast gain transient response. This may be especially important for embodiments in which the first stage 104 has a high gain, as discussed further below.

In some embodiments, the dynamic EVM of the RF PA 100 may be about 3 percent or less, such as about 2 percent or less. The low dynamic EVM may provide improved signal linearity of RF PA 100, for example at high data rates.

The low value of the first supply voltage provides a number of benefits which may facilitate a low dynamic EVM for the first stage 104. For example, in embodiments in which the bias control module 132a includes a current mirror, a mirror transistor of the current mirror may be biased with a relatively low collector voltage. A low value for the first supply voltage (e.g., to match the collector voltage of the mirror transistor) may improve the transient response of Q1. Additionally, a low value of the first supply voltage may cause a small thermal change for Q1 when pulsing on and/or off, thereby improving the transient response. Furthermore, in some transistors (e.g., field-effect transistors), the gate lag effect is more pronounced for a higher supply voltage, which may contribute to the EVM. Thus, a low value for the first supply voltage may improve the gate lag effect of Q1 (e.g., in embodiments in which Q1 is a field-effect transistor), thereby improving the transient response of Q1.

Additionally, in prior RF PA designs, the first supply voltage across Q1 is dependent on VCC, and the RF PA exhibits high EVM at high VCC voltages. In RF PA 100, Q2 may isolate Q1 from VCC and provide a relatively low first supply voltage across Q1. The transient response of Q1 may be unaffected by the VCC voltage. Accordingly, the EVM of RF PA 100 may not degrade at high VCC voltages.

In various embodiments, the gain of the first stage 104 may be higher than the gains of the second stage 108 and/or third stage 112, respectively. Accordingly, the transient response of the first stage 104 may have a larger effect on the overall transient response of the RF PA 100 than the second stage 108 and/or third stage 112. In contrast, the third stage 112 may deliver a higher output power than the first stage 104 or second stage 108, and may thus require a higher supply voltage (e.g., the third supply voltage). Accordingly, the third supply voltage may be equal to the main supply voltage. In some embodiments, the second supply voltage may be equal to the main supply voltage, as shown in FIG. 1. In other embodiments, the second supply voltage may be less than the main supply voltage. For example, the second supply voltage may be substantially equal to the first supply voltage or may have a value greater than the first supply voltage and less than the third supply voltage. In these embodiments, an active load may be provided between Q3 and the main supply terminal 120 to lower the second supply voltage.

Figure 2:
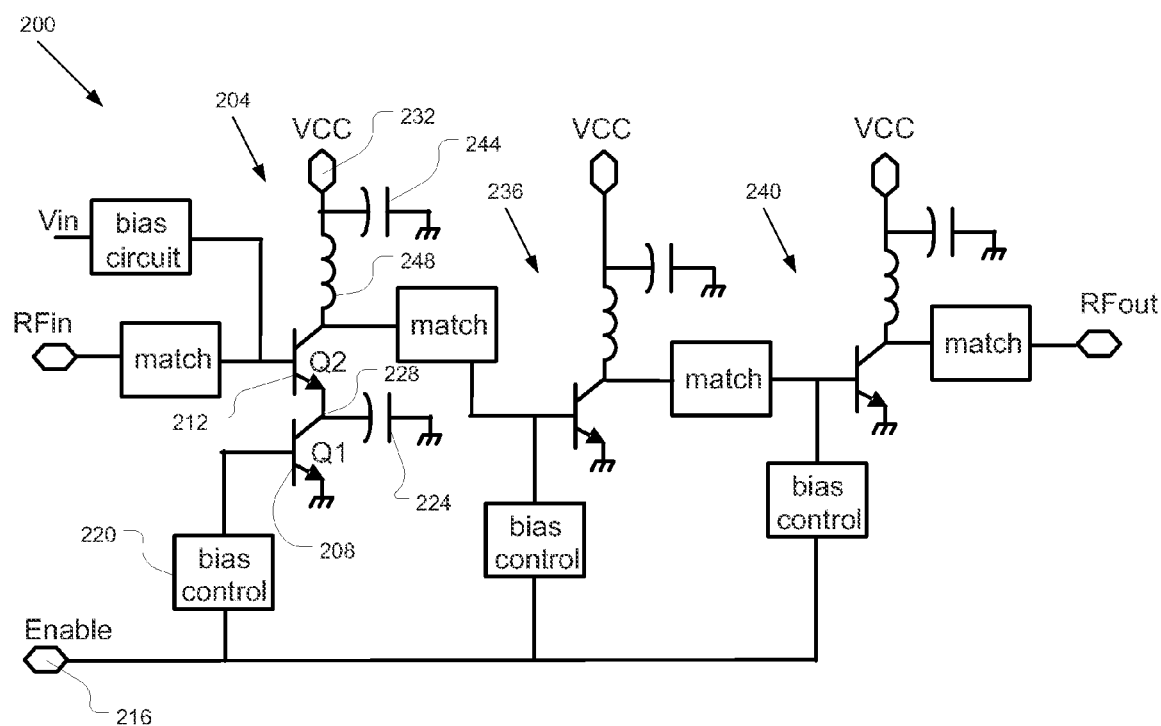
FIG. 2 illustrates an alternative configuration of a radio frequency power amplifier in accordance with various embodiments.

FIG. 2 illustrates an alternative embodiment of a RF PA 200 having a first stage 204 in which a first active device 208 (e.g., transistor Q1) is configured to receive an enable signal, and a second active device 212 (e.g., transistor Q2) is the RF amplifier (e.g., configured to amplify RFin). Transistor Q1 is coupled in series with Q2 and coupled with an enable terminal 216 to receive the enable signal (e.g., at the base terminal of Q1 through a bias control circuit 220). Q1 may act as a DC transistor to activate the first stage 204 in response to the enable signal. Q1 may be isolated from the RF path by a bypass capacitor 224 coupled to a node 228 between Q1 and Q2. Q2 may be coupled with a main supply terminal 232 configured to receive a main supply voltage. Q2 may cause a first supply voltage across Q1 to be less than the main supply voltage. The lower supply voltage across Q1 may cause Q1 to have a fast transient response. Since Q1 is coupled in series with Q2 (e.g., the emitter terminal of Q2 is coupled with the collector terminal of Q1), Q2 may have substantially the same DC current as Q1. Accordingly, Q2 may also have a fast transient response which is independent of the supply voltage VCC.

In various embodiments, Q2 may receive an RF input signal RFin (e.g., at the base terminal of Q2) and may pass an amplified RF output signal to a second stage 236 of RF PA 200. The second stage 236 may amplify the output signal of the first stage 204 and pass the amplified RF signal to a third stage 240. The third stage 240 may further amplify the RF signal to produce RFout.

In various embodiments, Q1 may also be referred to as the activating device (e.g., the device configured to receive the enable signal). In RF PA 200, Q2 is the amplifying device (e.g., the device configured to amplify RFin), while in RF PA 100 (shown in FIG. 1) Q1 is the amplifying device (as well as the activating device).

In comparison with RF PA 100 shown in FIG. 1, the arrangement of RF PA 200 may allow a higher voltage to be dropped across the amplifying device while maintaining a fast transient response (e.g., low dynamic EVM). For example, a larger voltage may be dropped across Q2 than across Q1. The low voltage across Q1 may provide a fast transient response, while the higher voltage across Q2 may provide higher power transfer. For example, the voltage drop across Q2 may be about VCC-2V to about VCC-0.2V, and the first supply voltage across Q1 may be about 0.2V to about 2V.

RF PA 200 may include a second bypass capacitor 244 that may not be included in RF PA 100. The second bypass capacitor 244 may be coupled with the main supply terminal 232 to isolate the main supply terminal from the RF path. A choking inductor 248 may be coupled between the main supply terminal 232 and Q2.

Figure 3:
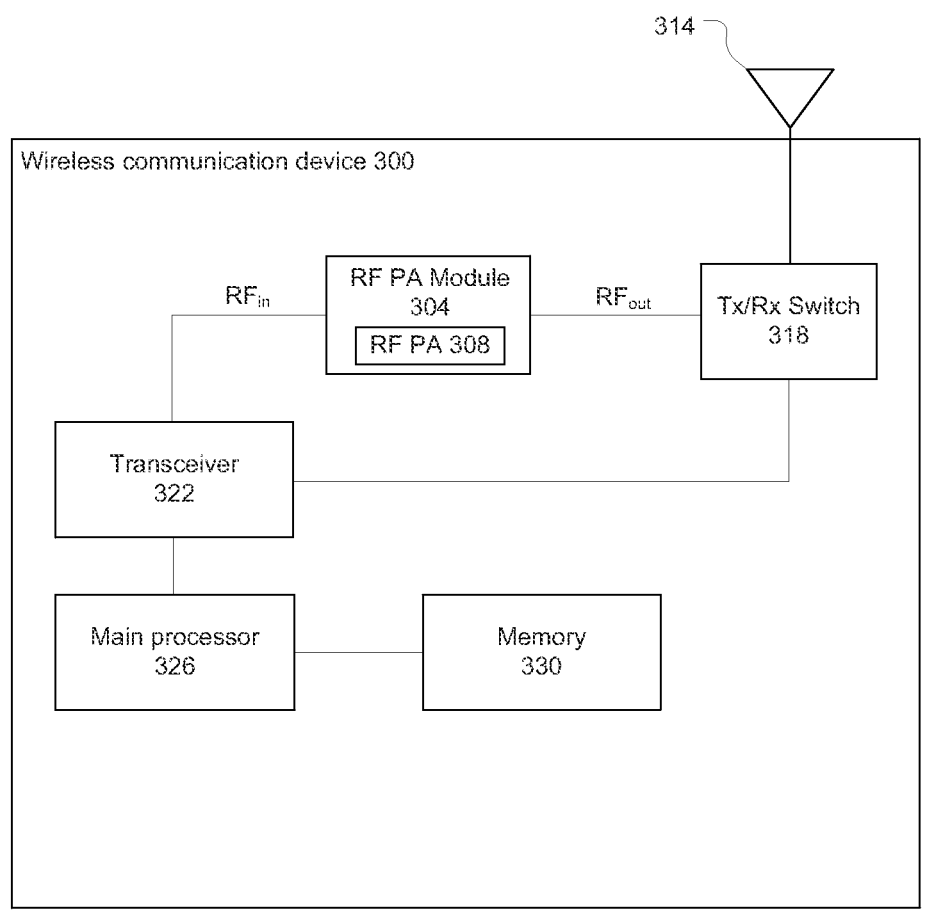
FIG. 3 is a block diagram of an exemplary wireless communication device in accordance with various embodiments.

A block diagram of an exemplary wireless communication device 300 is illustrated in FIG. 3 in accordance with some embodiments. Wireless communication device 300 may have a RF PA module 304 including one or more RF PAs 308, which may be similar to RF PA 100 and/or 200. In addition to the RF PA module 304, the wireless communication device 300 may have an antenna structure 314, a Tx/Rx switch 318, a transceiver 322, a main processor 326, and a memory 330 coupled with each other at least as shown. While the wireless communication device 300 is shown with transmitting and receiving capabilities, other embodiments may include devices with only transmitting or only receiving capabilities.

In various embodiments, the wireless communication device 300 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 326 may execute a basic operating system program, stored in the memory 330, in order to control the overall operation of the wireless communication device 300. For example, the main processor 326 may control the reception of signals and the transmission of signals by transceiver 322. The main processor 326 may be capable of executing other processes and programs resident in the memory 330 and may move data into or out of memory 330, as desired by an executing process.

The transceiver 322 may receive outgoing data (e.g., voice data, web data, e-mail, signaling data, etc.) from the main processor 326, may generate the $RF_{in}$ signal(s) to represent the outgoing data, and provide the $RF_{in}$ signal(s) to the RF PA module 304. The transceiver 322 may also control the RF PA module 304 to operate in selected bands and in either full-power or backoff-power modes. In some embodiments, the transceiver 322 may generate the $RF_{in}$ signal(s) using OFDM modulation.

The RF PA module 304 may amplify the $RF_{in}$ signal(s) to provide $RF_{out}$ signal(s) as described herein. The $RF_{out}$ signal(s) may be forwarded to the Tx/Rx switch 318 and then to the antenna structure 314 for an over-the-air (OTA) transmission. In some embodiments, Tx/Rx switch 318 may include a duplexer.

In a similar manner, the transceiver 322 may receive an incoming OTA signal from the antenna structure 314 through the Tx/Rx switch 318. The transceiver 322 may process and send the incoming signal to the main processor 326 for further processing.

In various embodiments, the antenna structure 314 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 300 is given by way of example and that, for simplicity and clarity, only so much of the construction and operation of the wireless communication device 300 as is necessary for an understanding of the embodiments is shown and described. Various embodiments contemplate any suitable component or combination of components performing any suitable tasks in association with wireless communication device 300, according to particular needs. Moreover, it is understood that the wireless communication device 300 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
    an enable terminal configured to receive an enable signal;
    a main supply terminal configured to receive a main supply voltage; and
    a first radio frequency (RF) power amplifier (PA) stage coupled with the enable terminal and the supply terminal, the first RF PA stage including:
        a first active device configured to receive the enable signal and to turn on in response to the enable signal to activate the first RF PA stage;
        a second active device coupled in series with the first active device and configured to receive the main supply voltage and to provide a first supply voltage across the first active device that is less than and independent of the main supply voltage; and a bypass capacitor coupled with a node between the first active device and second active device to divert RF signals at the node;

wherein one of the first active device or the second active device is configured to receive an RF input signal and to pass an amplified RF output signal to a second RF PA stage.

2. The circuit of claim 1, wherein the first active device is configured to receive the RF input signal and to pass the amplified RF output signal to the second RF PA stage.

3. The circuit of claim 2, wherein the second active device is configured to provide an active load between the first active device and the main supply terminal.

4. The circuit of claim 1, wherein the second active device is configured to receive the RF input signal and to pass the amplified RF output signal to the second RF PA stage.

5. The circuit of claim 1, further comprising a bias control module coupled between the enable terminal and the first active device to bias the first active device.

6. The circuit of claim 1, wherein the second RF PA stage includes a third active device configured to amplify the RF output signal of the first RF PA stage, the third active device configured to receive a second supply voltage equal to the main supply voltage.

7. The circuit of claim 6, wherein the RF power amplifier further includes a third RF PA stage, the third RF PA stage including a fourth active device configured to amplify an RF output signal of the second RF PA stage, wherein the fourth active device is configured to receive a third supply voltage equal to the main supply voltage.

8. The circuit of claim 1, wherein the second RF PA stage includes a third active device configured to amplify the RF output signal of the first RF PA stage, wherein the third active device is configured to receive a second supply voltage that is less than the main supply voltage, and the circuit further comprising a third RF PA stage including a fourth active device configured to amplify an RF output signal of the second stage, wherein the fourth active device is configured to receive a third supply voltage that is equal to the main supply voltage.

9. The circuit of claim 1, wherein the circuit has a dynamic error vector magnitude (EVM) of 3 percent or less.

10. The circuit of claim 1, wherein the first active device includes a first heterojunction bipolar transistor and the second active device includes a second heterojunction bipolar transistor.

11. A radio frequency (RF) power amplifier, comprising:
a main supply terminal configured to receive a main supply voltage;
an enable terminal configured to receive an enable voltage to turn on the RF power amplifier;
a first stage including:
a first transistor having a base terminal coupled with the enable terminal, an emitter terminal coupled with a ground terminal, and a collector terminal; and
a second transistor having a collector terminal coupled with the main supply terminal and an emitter terminal coupled with the collector terminal of the first transistor;
wherein one of the first transistor or the second transistor is configured to receive an RF input signal and produce an amplified RF output signal; and a second stage having a third transistor configured to amplify the RF output signal of the first stage, the third transistor having a base terminal coupled with the enable terminal, a collector terminal coupled with the main supply terminal, and an emitter terminal coupled with the ground terminal.

12. The RF power amplifier of claim 11, further including a bias control module coupled between the enable terminal and the base terminal of the first transistor.

13. The RF power amplifier of claim 11, wherein the first transistor is configured to receive the RF input signal and produce the amplified RF output signal.

14. The RF power amplifier of claim 11, wherein the second transistor is configured to receive the RF input signal and produce the amplified RF output signal.

15. A radio frequency (RF) power amplifier, comprising:
a main supply terminal configured to receive a main supply voltage;
an enable terminal configured to receive an enable voltage to turn on the RF power amplifier;
a first transistor having a base terminal coupled with the enable terminal, an emitter terminal coupled with a ground terminal, and a collector terminal; and
a second transistor having a collector terminal coupled with the main supply terminal and an emitter terminal coupled with the collector terminal of the first transistor; and
a bypass capacitor coupled between the emitter terminal of the second transistor and the ground terminal;
wherein one of the first transistor or the second transistor is configured to receive an RF input signal and produce an amplified RF output signal.

16. A system, comprising:
a transmitter configured to produce a radio frequency (RF) input signal to be transmitted over a wireless communication network;
an RF power amplifier coupled to the transmitter and configured to amplify the RF input signal, the RF power amplifier configured to receive a main supply voltage, and the RF power amplifier including:
a first stage having:
a first transistor configured to receive the RF input signal and produce an amplified RF output signal;
a second transistor coupled in series with the first transistor so that a first supply voltage across the first transistor is less than the main supply voltage; and
a bypass capacitor coupled with a first node between the first transistor and the second transistor; and
a second stage configured to amplify the RF output signal of the first stage, the second stage having a third transistor configured to receive a second supply voltage, wherein the second supply voltage is greater than the first supply voltage.

17. The system of claim 16, wherein the first transistor is coupled with an enable terminal and configured to receive an enable signal to turn on the first transistor.

18. The system of claim 16, wherein the second transistor is coupled with an enable terminal and configured to receive an enable signal to turn on the second transistor.

19. The system of claim 16 wherein the wireless communication network uses frequency division duplexing (FDD), and wherein the enable signal is a square wave.

* * * * *